US011231365B2

(12) United States Patent
Choi et al.

(10) Patent No.: US 11,231,365 B2
(45) Date of Patent: Jan. 25, 2022

(54) APPARATUS AND METHOD FOR INFRARED IMAGING

(71) Applicants: Hanwha Systems Co., Ltd., Gumi-Si (KR); KYUNGPOOK NATIONAL UNIVERSITY INDUSTRY-ACADEMIC COOPERATION FOUNDATION, Daegu (KR)

(72) Inventors: Bong Jun Choi, Gumi-Si (KR); Ho Jin Hyun, Gumi-Si (KR); Jong Hoo Park, Daegu (KR); Dae Kyeong Kang, Yeongcheon-Si (KR)

(73) Assignees: Hanwha Systems Co., Ltd.; KYUNGPOOK NATIONAL UNIVERSITY INDUSTRY-ACADEMIC COOPERATION FOUNDATION

( * ) Notice: Subject to any disclaimer, the term of this patent is extended or adjusted under 35 U.S.C. 154(b) by 100 days.

(21) Appl. No.: 16/524,001

(22) Filed: Jul. 26, 2019

(65) Prior Publication Data

US 2021/0014434 A1    Jan. 14, 2021

(30) Foreign Application Priority Data

Jul. 8, 2019 (KR) .......................... 10-2019-0082161
Jul. 8, 2019 (KR) .......................... 10-2019-0082162

(51) Int. Cl.
*G01N 21/552* (2014.01)
*G01N 21/59* (2006.01)
(Continued)

(52) U.S. Cl.
CPC ............ *G01N 21/553* (2013.01); *G01J 3/108* (2013.01); *G01N 21/35* (2013.01); *G01N 21/552* (2013.01);
(Continued)

(58) Field of Classification Search
CPC .. G01N 21/552; G01N 21/553; G01N 21/554; G01N 2203/0641; G01N 21/59; G01N 2021/5903
(Continued)

(56) References Cited

U.S. PATENT DOCUMENTS 5,322,798 A * 6/1994 Sadowski ............ G01N 21/553
                                                                  356/317
6,330,062 B1 * 12/2001 Corn ...................... G01N 21/35
                                                                  356/445

(Continued)

FOREIGN PATENT DOCUMENTS

JP       2009042164 A     2/2009
KR    20100106082 A    10/2010
(Continued)

OTHER PUBLICATIONS

An English translation of KR20100106082A by Patent Translate.*
An English translation of JP2009042164A by Patent Translate.*

*Primary Examiner* — Allen C. Ho
(74) *Attorney, Agent, or Firm* — Renaissance IP Law Group LLP

(57) ABSTRACT

Provided are an apparatus and a method for infrared imaging, more particularly, an apparatus and a method for infrared imaging, which receive infrared light, emitted from a target, and output the received infrared light as an image. An infrared imaging apparatus, in accordance with an exemplary embodiment, receives infrared light, emitted from a target, and outputs the received infrared light as an image. The infrared imaging apparatus includes: a reaction unit having physical properties changing in response to the received infrared light; a light source unit for generating measurement light irradiated toward the reaction unit; and an imaging unit for detecting the measurement light with the light quantity thereof changing depending on a change in the (Continued)

100a : 110a, 120a, 130a, 140a, 150a, 160a, 170a, 180a
200a : 210a : 220a
300a : 310a, 320a physical properties of the reaction unit and outputting the detected measurement light as an image.

14 Claims, 9 Drawing Sheets

(51) Int. Cl.
    *H04N 5/33* (2006.01)
    *G01N 21/35* (2014.01)
    *H01L 27/146* (2006.01)
    *G01J 3/10* (2006.01)

(52) U.S. Cl.
    CPC .......... *G01N 21/554* (2013.01); *G01N 21/59* (2013.01); *H01L 27/14649* (2013.01); *H04N 5/33* (2013.01); *G01N 2021/5903* (2013.01); *G01N 2203/0641* (2013.01)

(58) Field of Classification Search
    USPC .............. 250/316.1, 338.1, 339.14, 330–332
    See application file for complete search history.

(56) References Cited

U.S. PATENT DOCUMENTS

| | | | | |
|---|---|---|---|---|
| 6,421,128 B1* | 7/2002 | Salamon | G01N 21/33 | 356/445 |
| 6,570,657 B1* | 5/2003 | Hoppe | G01J 3/04 | 356/445 |
| 6,731,388 B1* | 5/2004 | Simon | G01N 21/553 | 356/445 |
| 6,862,094 B2* | 3/2005 | Johansen | G01N 21/553 | 356/445 |
| 6,867,865 B2* | 3/2005 | Vaupel | G01N 21/553 | 356/445 |
| 7,030,989 B2* | 4/2006 | Yager | G01N 21/553 | 356/445 |
| 7,221,456 B2* | 5/2007 | Kanai | G01N 21/553 | 356/445 |
| 7,332,329 B2* | 2/2008 | Wark | B82Y 30/00 | 385/12 |
| 7,670,556 B2* | 3/2010 | Corn | G01N 21/6458 | 422/68.1 |
| 7,671,995 B2* | 3/2010 | Lin | G01N 21/553 | 356/445 |
| 7,705,280 B2* | 4/2010 | Nuzzo | G01N 21/554 | 250/208.1 |
| 7,820,968 B2* | 10/2010 | Sakemoto | H04N 5/33 | 250/330 |
| 7,998,672 B2* | 8/2011 | Roper | G01N 33/587 | 435/6.12 |
| 8,031,341 B2* | 10/2011 | Quesnel | G01N 21/553 | 356/445 |
| 8,159,676 B2* | 4/2012 | Gryczynski | G01N 21/648 | 356/445 |
| 8,163,561 B2* | 4/2012 | Fontaine | G01N 21/553 | 436/164 |
| 8,242,446 B2* | 8/2012 | Fleury-Frenette | G01J 5/40 | 250/336.1 |
| 8,290,314 B2* | 10/2012 | Fujimaki | G01N 21/552 | 385/12 |
| 8,298,495 B2* | 10/2012 | Lee | G01N 21/648 | 422/402 |
| 8,481,937 B2* | 7/2013 | Matsumoto | H01J 40/06 | 250/332 |
| 8,508,742 B2* | 8/2013 | Charette | G01N 21/553 | 356/445 |
| 8,530,243 B2* | 9/2013 | Ran | G02B 3/005 | 436/164 |
| 8,705,039 B2* | 4/2014 | Cho | G01N 21/553 | 356/445 |
| 8,717,563 B2* | 5/2014 | Matsumoto | G01N 21/553 | 356/338 |
| 8,786,859 B2* | 7/2014 | Lee | G01N 21/553 | 356/445 |
| 8,859,267 B2* | 10/2014 | Seyama | G01N 33/54373 | 435/288.7 |
| 8,937,721 B2* | 1/2015 | Fujimaki | G01N 21/553 | 356/445 |
| 8,982,353 B2* | 3/2015 | Masson | G01N 21/553 | 356/445 |
| 9,207,117 B2* | 12/2015 | Booksh | G01N 21/553 | |
| 9,244,008 B2* | 1/2016 | Kang | G01N 21/47 | |
| 9,285,314 B2* | 3/2016 | Pacifici | G01N 21/45 | |
| 9,285,534 B2* | 3/2016 | Lee | G02B 5/008 | |
| 9,395,363 B2* | 7/2016 | Valsesia | G01N 33/54373 | |
| 9,518,926 B2* | 12/2016 | Abdulhalim | G01N 33/54373 | |
| 9,535,003 B2* | 1/2017 | Nishio | G01N 21/553 | |
| 9,546,948 B2* | 1/2017 | Shimoyama | G01N 21/27 | |
| 9,651,487 B2* | 5/2017 | Smith | G02B 5/04 | |
| 9,671,327 B2* | 6/2017 | Pinchuk | G01N 33/54373 | |
| 10,048,200 B2* | 8/2018 | Abdulhalim | G01N 21/554 | |
| 10,107,748 B2* | 10/2018 | Wong | G01N 21/553 | |
| 10,241,102 B2* | 3/2019 | Fadaei | G01N 21/553 | |
| 10,254,216 B2* | 4/2019 | Sieben | G01N 21/05 | |
| 10,634,613 B2* | 4/2020 | Chiu | G01N 21/553 | |
| 10,718,711 B1* | 7/2020 | Guo | G01N 21/553 | |
| 10,768,108 B2* | 9/2020 | Ivarsson | G01N 21/553 | |
| 10,816,466 B2* | 10/2020 | Pollard | G01N 21/03 | |
| 10,859,493 B2* | 12/2020 | Cappo | G01N 21/553 | |
| 10,935,491 B2* | 3/2021 | Jiang | G01N 21/35 | |
| 2010/0051815 A1* | 3/2010 | Lee | B82Y 30/00 | 250/341.6 |

FOREIGN PATENT DOCUMENTS

| | | |
|---|---|---|
| KR | 20150013442 A | 2/2015 |
| KR | 20170113448 A | 10/2017 |

\* cited by examiner

100b : 110b, 120b, 130b, 140b, 150b, 180b
200b : 210b, 220b
300b : 310b, 320b

APPARATUS AND METHOD FOR INFRARED IMAGING

CROSS-REFERENCE TO RELATED APPLICATION

This application claims priority to Korean Patent Application Nos. 10-2019-0082161 filed on Jul. 8, 2019 and 10-2019-0082162 filed on Jul. 8, 2019 and all the benefits accruing therefrom under 35 U.S.C. § 119, the contents of which are incorporated by reference in their entirety.

BACKGROUND

The present disclosure relates to an apparatus and a method for infrared imaging, and more particularly, to an apparatus and a method for infrared imaging, which receive infrared light emitted from a target and output the received infrared light as an image.

A key component of thermal imaging equipment that senses the difference between the intrinsic radiant energies released from a target at night without light is an infrared imaging system, such as an infrared camera.

A conventional infrared camera is mainly fabricated on the basis of a quantum well infrared photodetector (QWIP) based on a indium gallium arsenide (InGaAs), which is a compound semiconductor. The QWIP detects an electrical signal that is obtained when InGaAs absorbs the quantums in the near-infrared band and excites the electrons to a high energy level.

However, the QWIP is fabricated with expensive equipment and through a complex process, and the low production and the high price are becoming a barrier to the development of the related industries. Further, the transaction of InGaAs is restricted by the international traffic in arms regulations (ITAR). Thus, research on an infrared detector that can replace such a QWIP is being conducted.

SUMMARY

The present disclosure provides an apparatus and a method for infrared imaging, which may output an image by using, as measurement light, infrared light emitted from a target.

In accordance with an exemplary embodiment, an infrared imaging apparatus for receiving infrared light emitted from a target and outputting the received infrared light as an image detects measurement light having a wavelength band different from that of the infrared light and the light quantity thereof changing depending on the infrared light and outputs the detected measurement light as an image.

The infrared imaging apparatus may include: a reaction unit including a reactive layer with physical properties changing in response to the received infrared light; a light source unit disposed to irradiate the reaction unit with the measurement light; and an imaging unit disposed to detect the measurement light having passed through the reaction unit.

The measurement light may include visible light, and the imaging unit may include an image sensor configured to convert the visible light into electric charges and output the electric charges as an image.

The reaction unit may further include: a dielectric; and a metal layer provided on the dielectric, wherein the reactive layer is provided on the metal layer.

The light source unit may be disposed to irradiate a surface of the metal layer with the measurement light via the dielectric at a preset incident angle, and the imaging unit may be disposed to detect the measurement light reflected from the surface of the metal layer.

The light source unit may be disposed such that the measurement light is emitted at an incident angle at which the measurement light resonates with surface plasmons of the metal layer while the infrared light is not input thereto.

The reactive layer may include: an absorption layer formed of nanoparticles each including a quantum dot and provided on the metal layer; and an electric charge supply layer having a liquid state and provided on the absorption layer.

The quantum dot may include PbS and/or PbSe, and the electric charge supply layer may include triethanolamine-hydrochloride (TEA-HCl).

The reactive layer may further include an electric charge accumulation layer formed of metal nanoparticles and provided between the metal layer and the absorption layer.

The reactive layer may include a liquid crystal layer formed by dispersing, into liquid crystal, graphene nanoparticles or reduced graphene oxide nanoparticles.

The imaging unit may be disposed to detect the measurement light having passed through the reaction unit.

The light source unit may include a first polarizing plate configured to polarize the measurement light output from a light source, and the imaging unit may include a second polarizing plate configured to polarize the measurement light having passed through the reaction unit.

The first polarizing plate and the second polarizing plate may have optical axes in the same direction as each other or in directions orthogonal to each other.

The light source unit may be disposed to emit the measurement light in a direction crossing an input direction of the infrared light, and the reaction unit may further include a path adjustment part disposed at a position at which the input direction of the infrared light crosses an irradiation direction of the measurement light to input the infrared light and the measurement light to the reactive layer in the same direction.

The path adjustment part may include a dichroic mirror configured to transmit the infrared light and reflect the measurement light.

The reactive layer may include a liquid crystal layer formed by dispersing, into liquid crystal, graphene nanoparticles or reduced graphene oxide nanoparticles.

In accordance with another exemplary embodiment, an infrared imaging method includes: inputting infrared light, emitted from a target, to a reaction unit; irradiating the reaction unit with measurement light; detecting the measurement light with the light quantity thereof changing depending on a change in the physical properties of at least a portion of the reaction unit due to the infrared light; and outputting the distribution of the light quantity of the detected measurement light.

The irradiating of the measurement light may include irradiating, with the measurement light, an area in which regions, to which the infrared light is input, are all superimposed.

The detecting of the measurement light may include: changing the reflectance of the measurement light depending on the change in the physical properties of the at least a portion of the reaction unit; and detecting the measurement light with the changed reflectance.

The detecting of the measurement light may include: changing the transmittance of the measurement light depending on the change in the physical properties of the at least a portion of the reaction unit; and detecting the measurement light with the changed transmittance.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
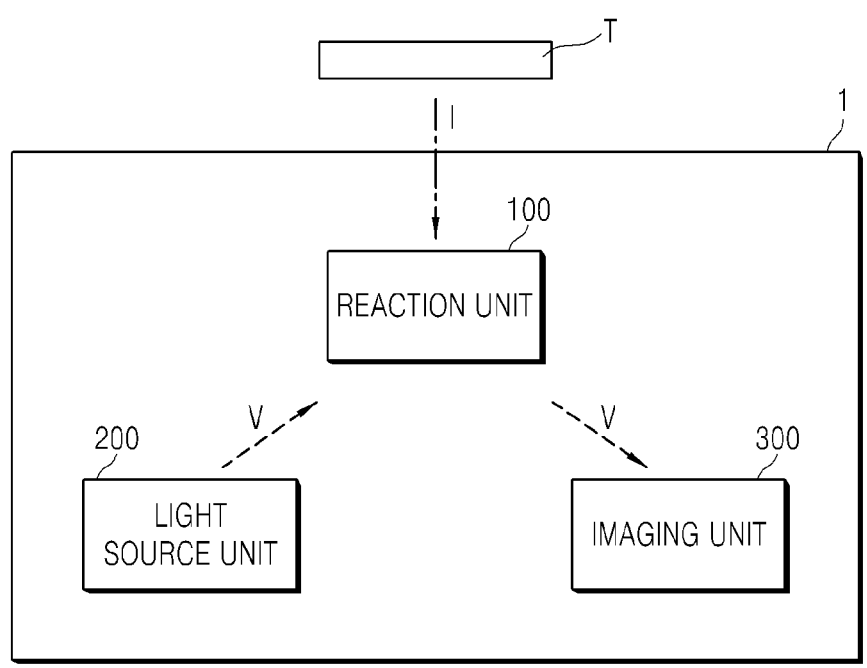
FIG. 1 is a diagram schematically illustrating an infrared imaging apparatus in accordance with an exemplary embodiment.

Hereinafter, embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Throughout the specification, it will be understood that when an element, such as a layer, region or substrate, is referred to as being "on," "connected to," or "coupled to" another element, it can be directly "on," "connected to," or "coupled to" the other element, or other elements interposed therebetween may be present.

Spatially relative terms, such as "above," "upper," "below," and "lower" and the like, may be used herein for ease of description to describe one element's relationship to other element(s) as shown in the figures. It will be understood that the spatially relative terms are intended to encompass different orientations of the device in use or operation in addition to the orientation depicted in the figures. Here, the drawings may be exaggerated to explain the invention in detail, and like reference numerals refer to like elements throughout.

FIG. 1 is a diagram schematically illustrating an infrared imaging apparatus in accordance with an exemplary embodiment.

Referring to FIG. 1, an infrared imaging apparatus 1 in accordance with an exemplary embodiment for receiving infrared light I, emitted from a target T, and outputting the received infrared light I as an image detects measurement light V having a wavelength band different from that of the infrared light I and the light quantity thereof changing depending on the infrared light I and outputs the detected measurement light V as an image.

For example, the infrared imaging apparatus 1 in accordance with an exemplary embodiment does not directly detect the infrared light I and output the detected infrared light I as an image, but detects the measurement light V having the wavelength band different from that of the infrared light I and the light quantity thereof changing depending on the infrared light I and outputs, as an image, the distribution of the light quantity of the detected measurement light V.

Figure 2:
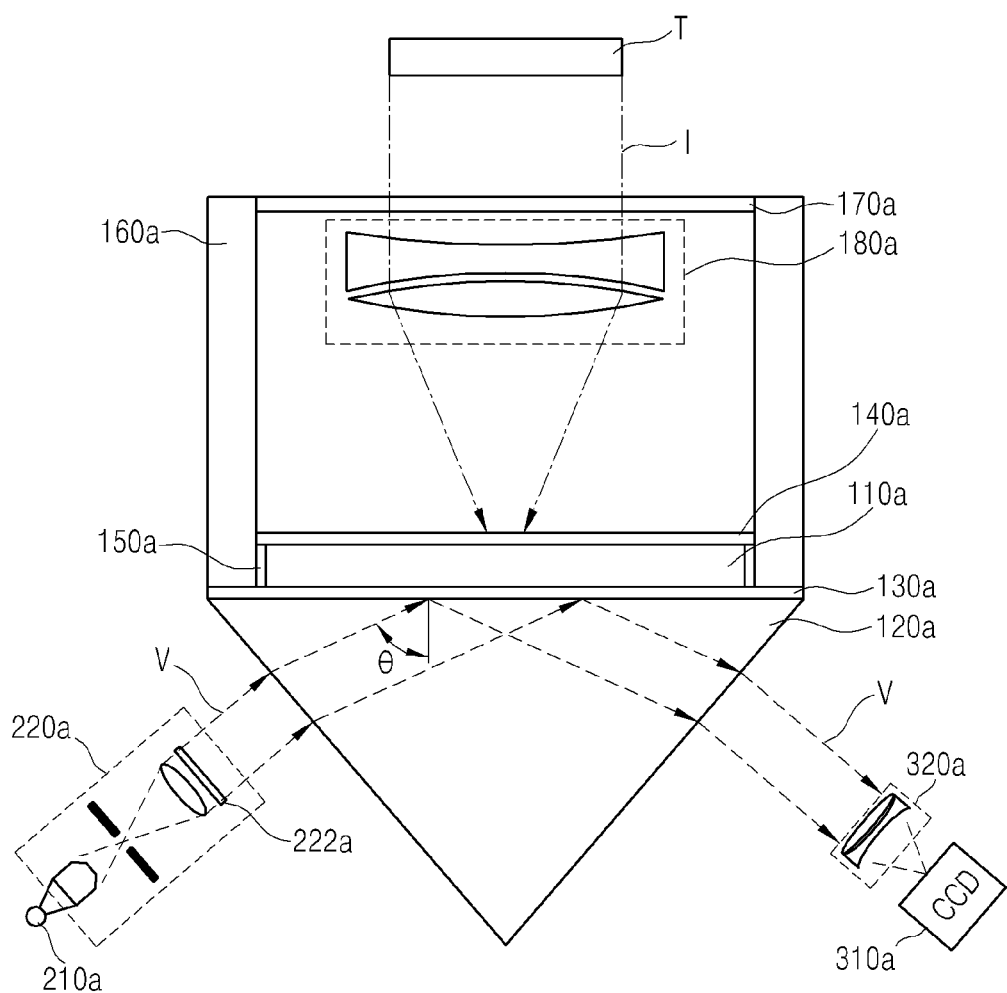
FIG. 2 is a view illustrating an infrared imaging apparatus in accordance with an exemplary embodiment.

To this end, the infrared imaging apparatus 1 in accordance with an exemplary embodiment may include a reaction unit 100 including a reactive layer 110a of FIG. 2 (or a reactive layer 110b of FIG. 7) with physical properties changing in response to the received infrared light I, a light source unit 200 disposed to irradiate the reaction unit 100 with the measurement light V, and an imaging unit 300 disposed to detect the measurement light V having passed through the reaction unit 100.

The target T may include various objects or environments for emitting the infrared light I. As described above, the infrared light I emitted from the target T is input to the reaction unit 100, and the physical properties of at least a portion of the reaction unit 100, for example, the reactive layer 110a, change in response to the input infrared light I. In this case, the physical properties of the reactive layer 110a may include the electrical, thermal, chemical, and mechanical properties of the reactive layer 110a. The electrical, thermal, chemical, and mechanical properties of the reactive layer 110a may variously change according to the distribution of the light quantity of the infrared light I input within regions to which the infrared light I is input.

The light source unit 200 is disposed to irradiate the reaction unit 100 with the measurement light V. The light source unit 200 may include a light source 210a of FIG. 2 (or a light source 210b of FIG. 7) for generating the measurement light V. In this case, the measurement light V may have the wavelength band different from that of the infrared light I input to the reaction unit 100. For example, the measurement light V may include visible light, and a laser beam having a specific wavelength may also be used as the measurement light V. The measurement light V, generated and output from the light source 210a, is irradiated toward the reaction unit 100, and the measurement light V may be emitted at a metal layer 130a having one surface on which the reactive layer 110a is disposed to pass through the reaction unit 100 (see FIG. 2), or may also be directly emitted at the reactive layer 110b to pass through the reaction unit 100 (see FIG. 7), as described below.

The imaging unit 300 is disposed to detect the measurement light V having passed through the reaction unit 100. For example, the imaging unit 300 detects the measurement light V with the light quantity thereof changing depending on a change in the physical properties of the reactive layer 110a and outputs the detected measurement light V as an image. In this case, the measurement light V input to the imaging unit 300 may be reflected from the metal layer having the one surface on which the reactive layer 110a is disposed (see FIG. 2), or may pass through the reactive layer 110b (see FIG. 7), as described below. The imaging unit 300 detects the distribution of the light quantity of the measurement light V that is emitted from the light source unit 200 and has the light quantity thereof changing depending on the physical properties of the reactive layer 110a. When the visible light is used as the measurement light V as described above, the imaging unit 300 may include an image sensor 310a of FIG. 2 (or an image sensor 310b of FIG. 7), such as a charge-coupled device (CCD) camera, converting the visible light into electric charges and outputting the electric charges as an image.

Such an infrared imaging apparatus 1 will hereinafter be described in more detail in accordance with exemplary embodiments.

FIG. 2 is a view illustrating an infrared imaging apparatus 1 in accordance with an exemplary embodiment.

Referring to FIG. 2, the infrared imaging apparatus 1 in accordance with an exemplary embodiment includes a reaction unit 100a including the reactive layer 110a with physical properties changing in response to input infrared light I, a light source unit 200a disposed to irradiate the reaction unit 100a with measurement light V, and an imaging unit 300a disposed to detect the measurement light V having passed through the reaction unit 100a, so as to detect, by an optical method, a change in the physical properties of the reactive layer 110a depending on the input infrared light I and output the detected change as an image, as described above. The description described above with reference to FIG. 1 may be applied in the same manner, and a duplicate description thereof will thus be omitted.

In this case, the infrared imaging apparatus 1 in accordance with an exemplary embodiment may use a surface plasmon resonance (SPR) phenomenon to detect, by the optical method, a change in the physical properties of the reactive layer 110a depending on the input infrared light I.

For example, the infrared imaging apparatus 1 in accordance with an exemplary embodiment may further include a dielectric 120a and a metal layer 130a provided on the dielectric 120a in addition to the reaction unit 100a, the light source unit 200a, and the imaging unit 300a described above. In this case, the reactive layer 110a may be provided on the metal layer 130a whereby the reactive layer 110a is disposed on one surface of the metal layer 130a, and the dielectric 120a is disposed on the other surface of the metal layer 130a, which is opposite to the one surface. Thus, the infrared imaging apparatus 1 in accordance with an exemplary embodiment may include the reaction unit 100a including the dielectric 120a, the metal layer 130a provided on the dielectric 120a, and the reactive layer 110a provided on the metal layer 130a and having physical properties changing in response to the input infrared light I, the light source unit 200a disposed to irradiate the reaction unit 100a with the measurement light V, and the imaging unit 300a disposed to detect the measurement light V having passed through the reaction unit 100a.

The dielectric 120a may be formed of various dielectric materials and may include a prism formed by cutting glass or the like. In this case, the prism may have a columnar shape with a triangular or semicircular cross section and has the metal layer 130a provided on one plane thereof.

The metal layer 130a is provided on the dielectric 120a. The metal layer 130a may be formed of at least one among gold (Au), silver (Ag), and platinum (Pt) and may be formed on the dielectric 120a to have a thickness of less than or equal to 50 nm. In this case, the light source unit 200a may be disposed such that the measurement light V is emitted at the other surface of the metal layer 130a at a preset incident angle through the dielectric 120a. Further, the imaging unit 300a may be disposed such that the measurement light V, reflected from the other surface of the metal layer 130a and passing through the dielectric 120a, is input thereto.

Surface plasmons are a type of electromagnetic wave traveling at the interface between the dielectric 120a and the metal layer 130a by the measurement light V emitted at the metal layer 130a. In this case, the surface plasmon resonance (SPR) phenomenon means that the measurement light V, emitted at the interface between the dielectric 120a and the metal layer 130a from the light source unit 200a, is almost entirely absorbed when the measurement light V is incident at the interface between the dielectric 120a and the metal layer 130a at a specific angle having a value of greater than or equal to an angle, that is, a resonance angle, at which the total reflection thereof occurs.

Figure 3:
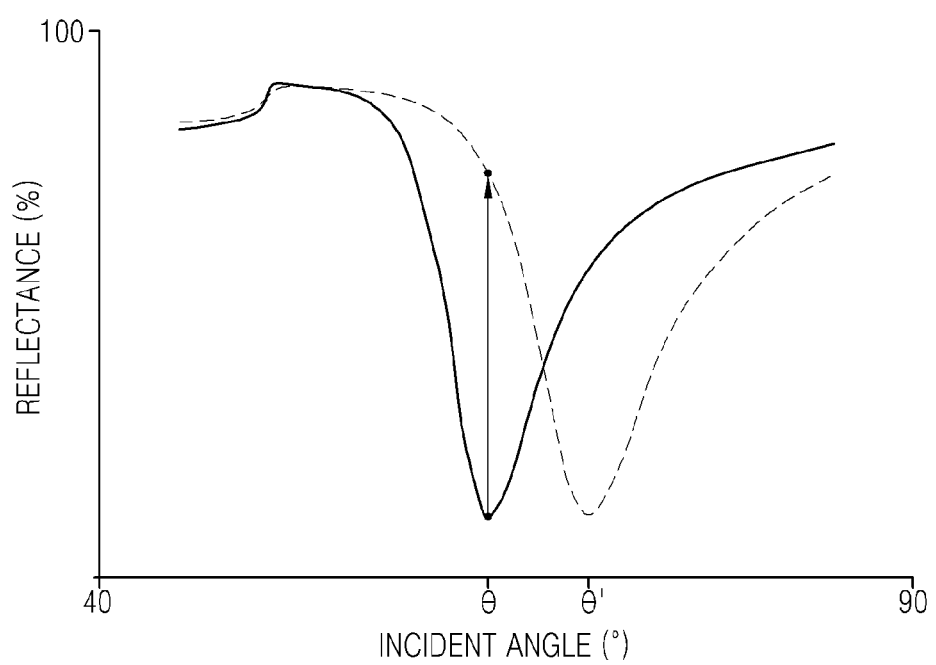
FIG. 3 is a graph illustrating the reflectance of a metal layer according to an incident angle of measurement light in accordance with an exemplary embodiment.

FIG. 3 is a graph illustrating the reflectance of a metal layer 130a according to an incident angle of measurement light.

As illustrated by a solid line in FIG. 3, the measurement light V is reflected from the other surface of the metal layer 130a when the measurement light V is emitted at an incident angle having a value of greater than or equal to an angle at which the total reflection thereof occurs. In this case, when the measurement light V is incident on the other surface of the metal layer 130a at an incident angle of θ° while the infrared light I is not input the reaction unit 100a, it can be seen that most of the measurement light V is absorbed at the interface between the dielectric 120a and the metal layer 130a by the SPR phenomenon. In this case, the incident angle, at which most of the measurement light V is absorbed at the interface between the dielectric 120a and the metal layer 130a, is defined as a resonance angle.

When the infrared light I is input to the reactive layer 110a such that the physical properties of the reactive layer 110a change, the resonance angle is changed from θ° to θ'°, as illustrated by dotted lines in FIG. 2. The change in the resonance angle changes the reflectance of the metal layer 130a, as illustrated by an arrow in FIG. 3. Thus, the light quantity of the measurement light V, reflected from the other surface of the metal layer 130a depending on a change in the physical properties of the reactive layer 110a, is changed, and the imaging unit 300a may detect the measurement light V with the changed light quantity and output the detected measurement light V as an image.

In this case, the light source unit 200a may be disposed such that the measurement light V is emitted at an incident angle at which the measurement light V resonates with the surface plasmons of the metal layer 130a while the infrared light I is not input to the reaction unit 100a, for example, the reactive layer 110a. For example, the light source unit 200a may be disposed such that the measurement light V is emitted at the other surface of the metal layer 130a at the resonance angle while the infrared light I is not input to the reaction unit 100a. In this case, when the infrared light I is not input to the reaction unit 100a for the reason or the like that the target T to be photographed is not present, an undesired image may be prevented from being output by significantly reducing the light quantity of the measurement light V input to the imaging unit 300a.

In this case, the reaction unit 100a may further include a first substrate 140a distanced from the metal layer 130a to receive the reactive layer 110a and a spacer 150a forming an inner space for receiving the reactive layer 110a between the metal layer 130a and the first substrate 140a.

The first substrate 140a may be formed of a transparent material to transmit the infrared light I. The first substrate 140a is distanced from the metal layer 130a, and the reactive layer 110a is disposed between the metal layer 130a and the first substrate 140a. The reason is that at least a portion of the reactive layer 110a may have a liquid state, as described below. The spacer 150a, forming the inner space for receiving the reactive layer 110a between the metal layer 130a and the first substrate 140a, is disposed along the edge of the metal layer 130a or the first substrate 140a, and the formed inner space receives the reactive layer 110a with the at least a portion having a liquid state.

Further, the reaction unit 100a may further include a housing part 160a extending from the edge of one plane of the dielectric 120a or the edge of the metal layer 130a along an input path of the infrared light I, and the other end of the housing part 160a, which is opposite to one end thereof making contact with the dielectric 120a or the metal layer 130a, may be blocked by a near-infrared transmitting filter 170a. In this case, the near-infrared transmitting filter 170a may selectively transmit the infrared light I having a specific wavelength band, for example, a wavelength band of greater than or equal to 0.9 μm to less than or equal to 1.7 μm.

The reaction unit 100a may further include a first optical part 180a disposed on the input path of the infrared light I to concentrate the infrared light I and input the concentrated infrared light I to the reactive layer 110a. The first optical part 180a may be disposed inside the housing part 160a to prevent the concentrated infrared light I from being exposed externally and may include at least one lens for refracting or diffracting the infrared light I. Although not illustrated, the first optical part 180a may further include a diaphragm for adjusting the total light quantity of the infrared light I and a focusing unit for adjusting the focal length of the infrared light I.

Meanwhile, the light source unit 200a may include the light source 210a for generating and outputting the measurement light V and a second optical part 220a disposed on an output path of the measurement light V generated by the light source 210a to concentrate the measurement light V and irradiate the reaction unit 100a with the measurement light V.

The light source 210a may include a point light source or a surface light source. When the light source 210a includes the point light source, the second optical part 220a may include a spatial filter for emitting the measurement light V output from the point light source. Further, the second optical part 220a may include at least one lens for refracting or diffracting the measurement light V. In this case, the spatial filter has a pinhole, and the measurement light V emitted by the spatial filter may be collimated to be parallel to an irradiation direction thereof via the at least one lens for refracting or diffracting the measurement light V. Further, the second optical part 220a may further include a first polarizing plate 222a for polarizing the measurement light V, and the measurement light V output from the light source 210a may be polarized by the first polarizing plate 222a in one direction. In addition, the light source 210a may further include a diaphragm for adjusting the total light quantity of the measurement light V and a focusing unit for adjusting the focal length of the measurement light V. Further, when white light is used as the measurement light V, a short-wavelength filter for transmitting only the measurement light V having a specific wavelength band may also be used if desired. For the previously polarized measurement light V, such as a laser beam, a half-wave plate may also be disposed between the light source unit 200a and the first polarizing plate 222a to obtain a desired polarization direction.

The imaging unit 300a may further include the image sensor 310a for detecting the measurement light V and outputting the detected measurement light V as an image and a third optical part 320a disposed on a transmission path of the measurement light V input to the image sensor 310a to concentrate the measurement light V and input the concentrated measurement light V to the image sensor 310a. In this case, the third optical part 320a may include at least one lens for refracting or diffracting the measurement light V and a diaphragm for adjusting the light quantity of the measurement light V input to the image sensor 310a and may further include a focusing unit for adjusting the focal length of the measurement light V input to the image sensor 310a.

Figure 4:
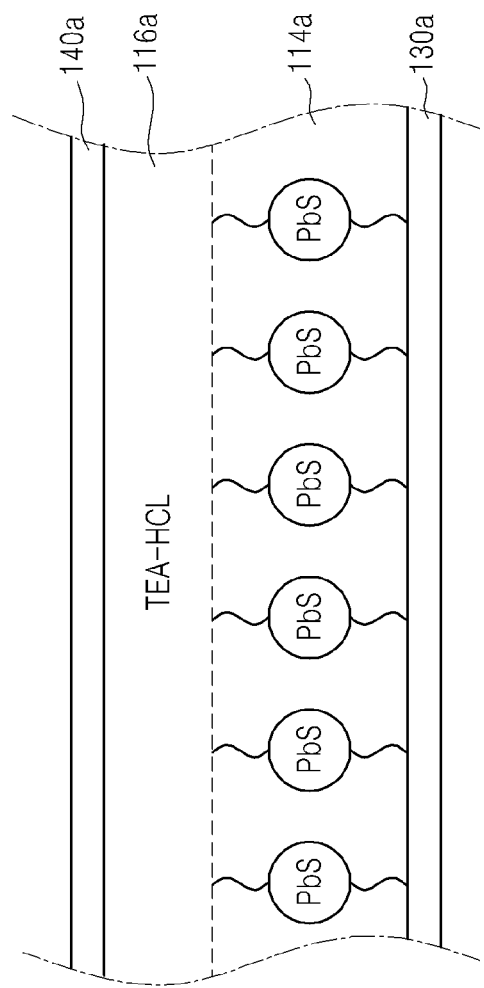
FIG. 4 is a view illustrating one structure of a reactive layer in accordance with an exemplary embodiment.
Figure 5:
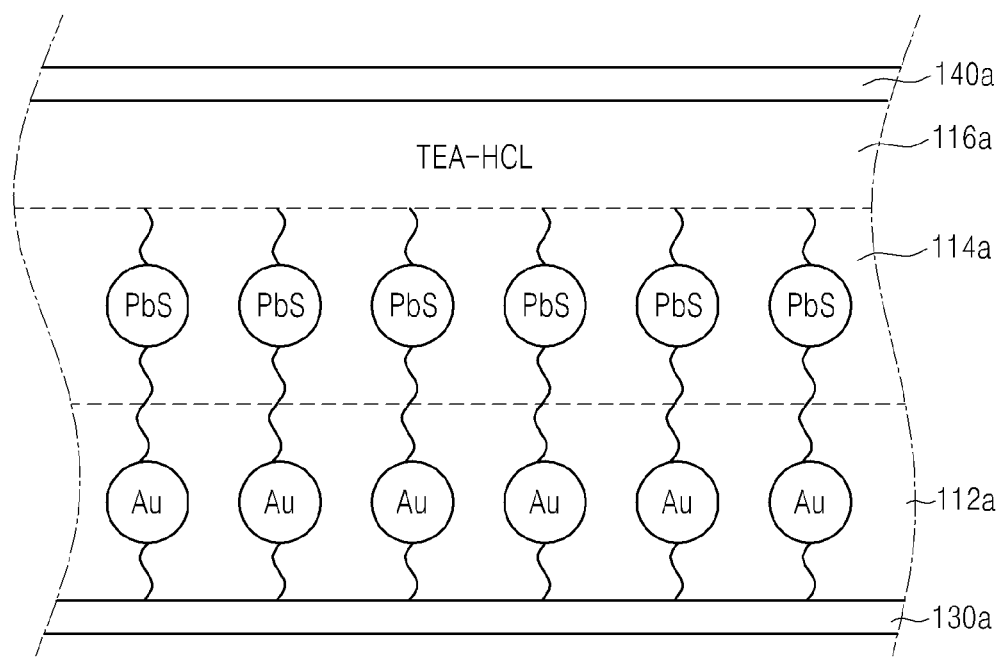
FIG. 5 is a view illustrating another structure of the reactive layer in accordance with an exemplary embodiment.
Figure 6:
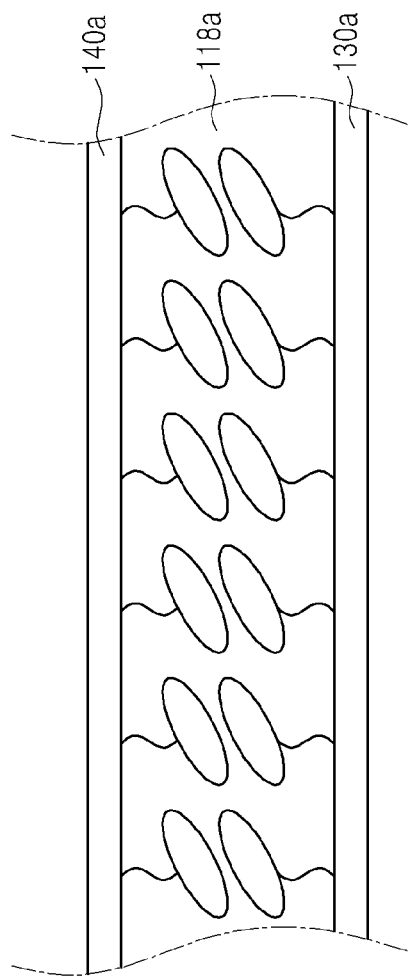
FIG. 6 is a view illustrating still another structure of the reactive layer in accordance with an exemplary embodiment.

Referring to FIGS. 4 to 6, the structure of the reactive layer 110a with physical properties changing depending on the input infrared light I will hereinafter be described in more detail.

FIG. 4 is a view illustrating one structure of a reactive layer 110a in accordance with an exemplary embodiment. FIG. 5 is a view illustrating another structure of the reactive layer 110a in accordance with an exemplary embodiment. FIG. 6 is a view illustrating still another structure of the reactive layer 110a in accordance with an exemplary embodiment.

Referring to FIG. 4, the reactive layer 110a in accordance with an exemplary embodiment may include an absorption layer 114a formed of nanoparticles including quantum dots and provided on the metal layer 130a and an electric charge supply layer 116a having a liquid state and provided on the absorption layer 114a.

Each of the quantum dots refers to a semiconductor crystal having a particle diameter of several nanometers and having a very small size. In this case, various semiconductor crystals may be used as the quantum dot, including CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, CdHgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb; SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, Si, Ge, SiC, and SiGe. However, the quantum dot may include PbS and/or PbSe having the improved properties of absorbing light in the infrared region.

The quantum dot may be functionalized by binding a first ligand to the surface thereof. The first ligand may be bound to the quantum dot to determine the size of the quantum dot and improve dispersion stability. An organic material may be used as the first ligand. Oleic acid may be used as the first ligand bound to the quantum dot. The oleic acid has the properties of having significantly improved dispersion stability in organic solvent, but not dissolving in aqueous solution. Thus, a thiol-based ligand, such as cysteamin, may be used as the first ligand. The thiol-based ligand refers to a compound in which a —SH functional group is bound to alkane, and the thiol-based ligand is readily soluble in water, thereby improving dispersion stability in aqueous solution and facilitating attachment to the metal layer 130a. The absorption layer 114a may be formed in a solid state by applying, to the metal layer 130a, a colloid including the quantum dot and the first ligand and drying the colloid.

The electric charge supply layer 116a serves to supply electric charges, that is, electrons, to the absorption layer 114a when the absorption layer 114a absorbs infrared light such that the electrons in the valence band are excited into the conduction band. Triethanolamine-hydrochloride (TEA-HCl) may be used as the electric charge supply layer 116a.

The TEA-HCl is present on the absorption layer 114a in a liquid state and provides a sufficient amount of electrons to the absorption layer 114a when the electrons are released from the absorption layer 114a.

As described above, when the reactive layer 110a includes the absorption layer 114a and the electric charge supply layer 116a, the infrared light I input through the first optical part 180a is input to the absorption layer 114a through the first substrate 140a. In this case, the quantum dot included in the absorption layer 114a absorbs the infrared light I, and the electrons excited from the valence band into the conduction band by the absorbed infrared light I change the angle at which the measurement light V resonates with the surface plasmons of the metal layer 130a. As a result, as the resonance angle is changed, the light quantity of the measurement light V reflected from the other surface of the metal layer 130a and input to the imaging unit 300a is increased, and the imaging unit 300a may receive the measurement light V with the increased light quantity and output the received measurement light V as an image.

Referring to FIG. 5, another structure of the reactive layer 110a in accordance with an exemplary embodiment may further include an electric charge accumulation layer 112a formed of metal nanoparticles and provided between the metal layer 130a and the absorption layer 114a. For example, the other structure of the reactive layer 110a in accordance with an exemplary embodiment includes the absorption layer 114a and the electric charge supply layer 116a described above with reference to FIG. 4 and additionally has the electric charge accumulation layer 112a provided between the metal layer 130a and the absorption layer 114a.

The electric charge accumulation layer 112a is charged as the electrons in the conduction band, excited from the absorption layer 114a, are transferred thereto, and the electric charge accumulation layer 112a may be formed of metal particles each having a particle diameter of several nanometers. In this case, at least one among Au, Ag, and Pt may be used as the metal particle.

The metal nanoparticle, included in the electric charge accumulation layer 112a, may be functionalized by binding a second ligand to the surface thereof. The second ligand may be bound to the metal nanoparticle to improve the binding force between the electric charge accumulation layer 112a and the absorption layer 114a, and tiopronin may be used as the second ligand. The tiopronin is bound to the cysteamin of the absorption layer 114a to improve the binding force between the electric charge accumulation layer 112a and the absorption layer 114a. The electric charge accumulation layer 112a may be formed by applying, to the metal layer 130a, a colloid including the metal nanoparticle and the second ligand and drying the colloid.

In this case, one surface of the metal layer 130a facing the reactive layer 110a may be functionalized with the cysteamin. For example, the one surface of the metal layer 130a facing the reactive layer 110a may be coated with the cysteamin bound to the metal layer 130a. Cysteamine and cysteine are all reactors and each include one nitrogen atom and two hydrogen atoms. One of the two hydrogen atoms of each of the cysteamine and the cysteamin is ionized in a water solution state, and the cysteamine and the cysteamin each having the one hydrogen atom ionized react with each other such that the ionized hydrogen atoms are covalently bound to each other, thereby being bound in a chemically stable state. Thus, the binding force between the metal layer 130a and the electric charge accumulation layer 112a may be improved.

As described above, when the electric charge accumulation layer 112a is disposed between the metal layer 130a and the absorption layer 114a, the electrons excited from the valence band into the conduction band by the absorbed infrared light I are transferred to the electric charge accumulation layer 112a. In this case, the electrons transferred to the electric charge accumulation layer 112a increase an amount of electric charges of the metal nanoparticle, and a change in the electrical properties of the metal nanoparticle changes the angle at which the measurement light V resonates with the surface plasmons of the metal layer 130a. As a result, as the resonance angle is changed, the light quantity of the measurement light V reflected from the other surface of the metal layer 130a and input to the imaging unit 300a is increased, and the imaging unit 300a may receive the measurement light V with the increased light quantity and output the received measurement light V as an image.

Referring to FIG. 6, still another structure of the reactive layer 110a in accordance with an exemplary embodiment may include a liquid crystal layer 118a formed by dispersing, into liquid crystal, graphene nanoparticles or reduced graphene oxide nanoparticles. In this case, the liquid crystal layer 118a may be formed by dispersing, into the liquid crystal, graphene nanoparticles or reduced graphene oxide nanoparticles each having a particle diameter of several nanometers. Further, various types of liquid crystal, such as 5CB, 8CB, and E7, and a combination thereof may also be used as the liquid crystal, into which the graphene nanoparticle or the reduced graphene oxide nanoparticle is dispersed.

The liquid crystal layer 118a is positioned in the inner space formed by the metal layer 130a, the first substrate 140a, and the spacer 150a, as described above. In this case, although not illustrated, an alignment layer may be formed on at least portions of one surface of the first substrate 140a facing the inner space, in which the liquid crystal layer 118a is received, and one surface of the metal layer 130a facing the inner space, in which the liquid crystal layer 118a is received.

The alignment layer may be formed on the at least portions of the surfaces of the metal layer 130a and the first substrate 140a each facing the inner space to align the liquid crystal, included in the liquid crystal layer 118a, in a uniform direction. The alignment layer may include self-assembled monolayers (SAMs), and 16-mercaptohexadecanoic may be used as the SAMs. Further, polyvinyl alcohol (PVA) or polyimide (PI) other than the SAMs may be used as the alignment layer. In this case, an alignment direction of the liquid crystal may be determined by a rubbing direction of the alignment layer.

As described above, when the reactive layer 110a includes the liquid crystal layer 118a, the infrared light I input through the first optical part 180a is input to the liquid crystal layer 118a through the first substrate 140a. In this case, the graphene nanoparticle dispersed into the liquid crystal absorb photo energy and converts the absorbed photo energy into heat to locally raise the temperature of the liquid crystal. The raised temperature of the liquid crystal varies the refractive index by changing the optical axis of the liquid crystal. The change in the refractive index changes the angle at which the measuring light V resonates with the surface plasmons of the metal layer 130a. As a result, as the resonance angle is changed, the light quantity of the measurement light V reflected from the other surface of the metal layer 130a and input to the imaging unit 300a is increased, and the imaging unit 300a may receive the measurement light V with the increased light quantity and output the received measurement light V as an image.

Figure 7:
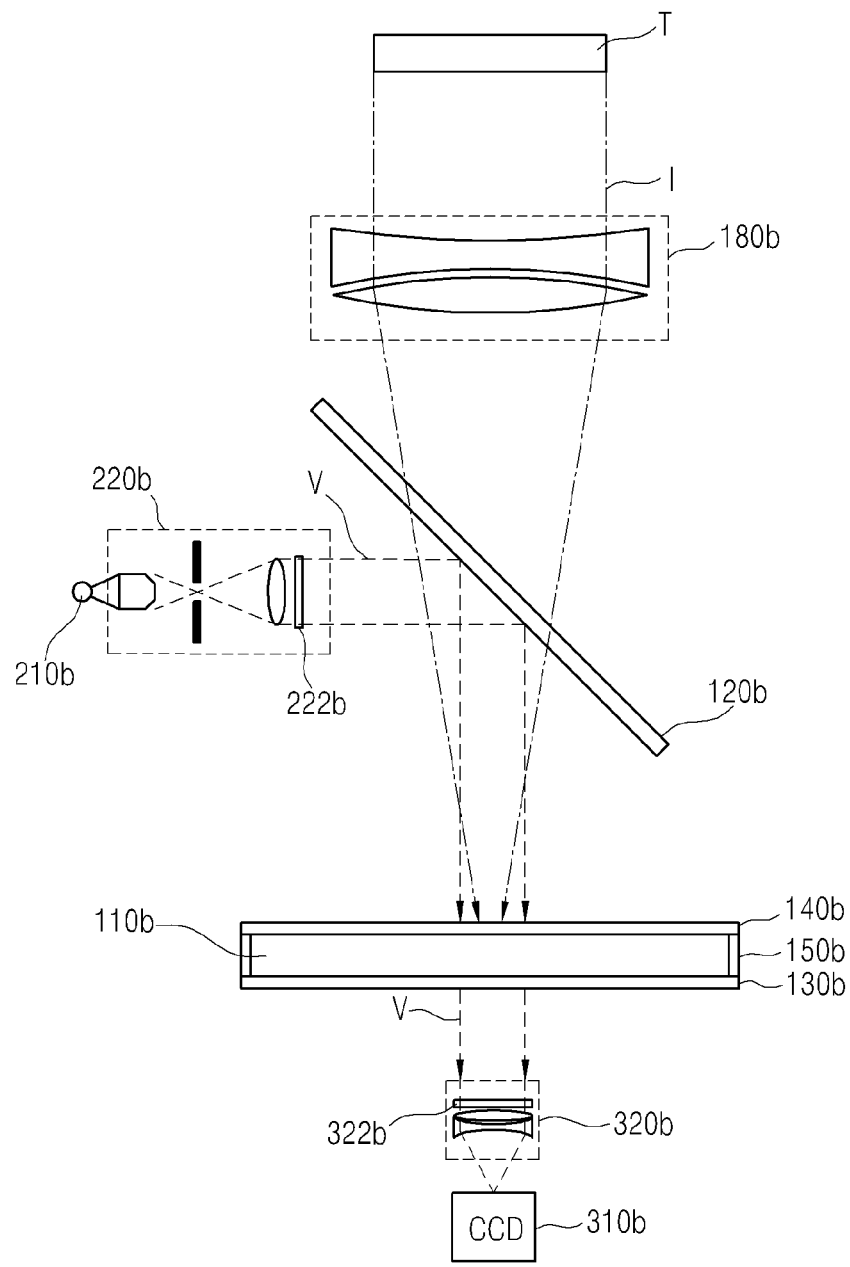
FIG. 7 is a view illustrating an infrared imaging apparatus in accordance with another exemplary embodiment.

FIG. 7 is a view illustrating an infrared imaging apparatus in accordance with another exemplary embodiment.

Referring to FIG. 7, the infrared imaging apparatus 1 in accordance with another exemplary embodiment includes a reaction unit 100b including the reactive layer 110b with physical properties changing in response to input infrared light I, a light source unit 200b disposed to irradiate the reaction unit 100b with measurement light V, and an imaging unit 300b disposed to detect the measurement light V having passed through the reaction unit 100b, so as to detect, by an optical method, a change in the physical properties of the reactive layer 110b depending on the input infrared light I and output the detected change as an image, as described above. The description described above with reference to FIG. 1 may be applied in the same manner, and a duplicate description thereof will thus be omitted.

In this case, the infrared imaging apparatus 1 in accordance with another exemplary embodiment may use a change in the transmittance of the measurement light V to detect, by the optical method, a change in the physical properties of the reactive layer 110b depending on the input infrared light I.

For example, the infrared imaging apparatus 1 in accordance with another exemplary embodiment includes the reaction unit 100b, the light source unit 200b, and the imaging unit 300b, and the imaging unit 300b detects the measurement light V having passed through the reaction unit 100b and outputs the detected measurement light V as an image.

In this case, the light source unit 200b may be disposed at various positions to irradiate the measurement light V toward the reaction unit 100b, but may be disposed to emit the measurement light V in a direction different from an input direction of the infrared light I, for example, a direction crossing the input direction of the infrared light I, to significantly reduce interference in the input infrared light I. In this case, the reaction unit 100b may further include a path adjustment part 120b to input the infrared light I and the measurement light V to the reaction unit 100ab in the same direction.

The path adjustment part 120b may include a dichroic mirror for transmitting the infrared light I and reflecting the measurement light V to input, to the reaction unit 100b, all of the infrared light I and the measurement light V, output in the direction different from the input direction of the infrared light I, in the same direction. When the input direction of the infrared light I and the output direction of the measurement light V form an angle of 90°, the dichroic mirror may be disposed to have an angle of 45° with respect to each of the input direction of the infrared light I and the output direction of the measurement light V such that the infrared light I and the measurement light V may be input to the reactive layer 110b in the same direction.

Further, the reaction unit 100b may further include a first substrate 140b, a second substrate 130b distanced from the first substrate 140b, and a spacer 150b for receiving the reactive layer 110b between the first substrate 140b and the second substrate 130b in order to receive the reactive layer 110b. For example, as illustrated in FIG. 7, the reactive layer 110b may be provided on the second substrate 130b, the first substrate 140b may be provided on the reactive layer 110b, and the spacer 150b may be disposed along the edges of the first substrate 140b and the second substrate 130b. In this case, the first substrate 140b and the second substrate 130b may be formed of transparent materials such that the infrared light I and the measurement light V are transmitted therethrough.

The reaction unit 100b may further include a first optical part 180b disposed on an input path of the infrared light I to concentrate the infrared light I and input the concentrated infrared light I to the reactive layer 110b. Further, the light source unit 200b may include the light source 210b for generating and outputting the measurement light V and a second optical part 220b disposed on an output path of the measurement light V generated by the light source 210b to concentrate the measurement light V and irradiate the reaction unit 100b with the measurement light V. Furthermore, the imaging unit 300b may further include the image sensor 310b for detecting the measurement light V and outputting the detected measurement light V as an image and a third optical part 320b disposed on a transmission path of the measurement light V input to the image sensor 310b to concentrate the measurement light V and input the concentrated measurement light V to the image sensor 310b. In this case, the description described above with reference to an exemplary embodiment may be applied to the first optical part 180b and the second optical part 220b. Further, the description described above with reference to an exemplary embodiment may be applied, except the third optical part 320b and except that the third optical part 320b further includes a second polarizing plate 322b, and thus, a duplicate description thereof will thus be omitted. The second polarizing plate 322b will be described below with reference to FIG. 8.

Figure 8:
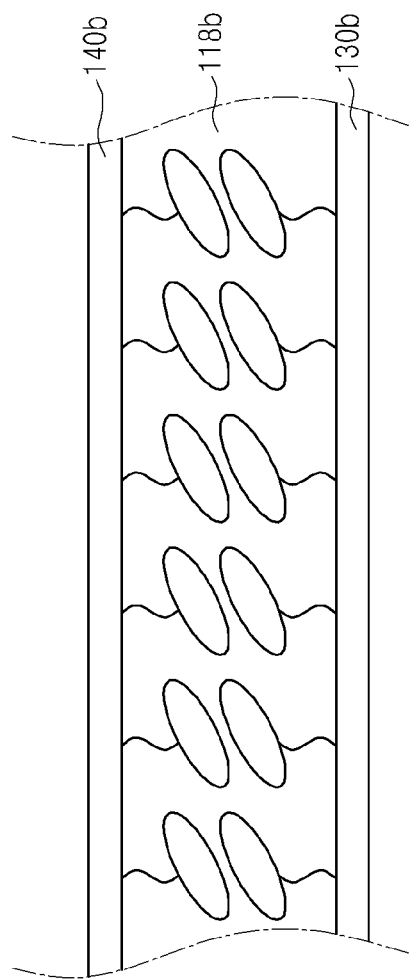
FIG. 8 is a view illustrating the structure of a reactive layer in accordance with another exemplary embodiment.

FIG. 8 is a view illustrating the structure of a reactive layer in accordance with another exemplary embodiment.

Referring to FIG. 8, the reactive layer 110b in accordance with another exemplary embodiment may include the liquid crystal layer 118a formed of graphene nanoparticles dispersed into the liquid crystal. In this case, the liquid crystal layer 118a only differs from that in an exemplary embodiment in that the liquid crystal layer 118a is provided on the second substrate 130b, and the description described above with reference to an exemplary embodiment may be applied thereto. For example, the liquid crystal layer 118a may be formed by dispersing, into the liquid crystal, graphene nanoparticles each having a particle diameter of several nanometers. In this case, the graphene nanoparticle may include a reduced graphene oxide nanoparticle. Further, various types of liquid crystal, such as 5CB, 8CB, and E7, and a combination thereof may also be used as the liquid crystal, into which the graphene nanoparticle is dispersed.

Further, an alignment layer may be formed on at least portions of one surface of the first substrate 140b facing the inner space, in which the liquid crystal layer 118a is received, and one surface of the second substrate 130b facing the inner space, in which the liquid crystal layer 118a is received, and the liquid crystal included in the liquid crystal layer 118a may be aligned in a uniform direction by the alignment layer. The alignment layer may include SAMs, and 16-mercaptohexadecanoic may be used as the SAMs. Further, PVA or PI other than the SAMs may be used as the alignment layer. In this case, an alignment direction of the liquid crystal may be determined by a rubbing direction of the alignment layer, as described above.

As described above, when the reactive layer 110b includes the liquid crystal layer 118a, the infrared light I input through the path adjustment part 120b is input to the liquid crystal layer 118a through the first substrate 140b. In this case, the graphene nanoparticle dispersed into the liquid crystal absorbs photo energy and converts the absorbed photo energy into heat to locally raise the temperature of the liquid crystal. The raised temperature of the liquid crystal varies the refractive index by changing the optical axis of the liquid crystal, and the change in the refractive index varies the transmittance of measurement light V by changing the phase difference between an extraordinary ray and an ordinary ray of the measurement light V.

As described above, the second optical part 220b included in the light source unit 200b may include the first polarizing plate 222b, and the third optical part 320b included in the imaging unit 300b may include the second polarizing plate 322b. In this case, the first polarizing plate 222b and the second polarizing plate 322b have the optical axes in the same direction as each other or in directions orthogonal to each other.

The measurement light V, output from the light source 210b and incident onto the first polarizing plate 222b, transmits each of the first polarizing plate 222b, the reactive layer 110b, and the second polarizing plate 322b to be input to the image sensor 310b. In this case, when the temperature of the liquid crystal rises and the optical axis of the liquid crystal changes, the ratio of the light quantity of the measurement light V having passed through the second polarizing plate 322b to the light quantity of the measurement light V incident onto the first polarizing plate 222b is changed by a change in angle between the optical axis of the first polarizing plate 222b or the second polarizing plate 322b and the optical axis of the liquid crystal. By the principle, the image sensor 310b may detect a change in the transmittance of the measurement light V and output the detected change as an image.

An infrared imaging method, in accordance with an exemplary embodiment, will hereinafter be described. The infrared imaging method may be performed by using the abovementioned infrared imaging apparatus 1, and a description overlapping with that described above with reference to the infrared imaging apparatus will thus be omitted.

Figure 9:
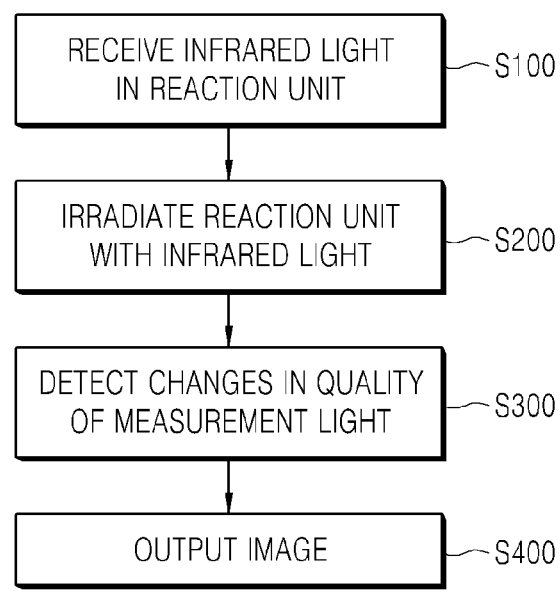
FIG. 9 is a flowchart schematically illustrating an infrared imaging method in accordance with an exemplary embodiment.

FIG. 9 is a flowchart schematically illustrating an infrared imaging method in accordance with an exemplary embodiment.

Referring to FIG. 9, the infrared imaging method in accordance with an exemplary embodiment includes an operation of inputting the infrared light I, emitted from the target T, to the reaction unit 100 (the reaction unit 100a or 100b) (S100), an operation of irradiating the reaction unit 100 (the reaction unit 100a or 100b) with the measurement light V (S200), an operation of detecting the measurement light V with the light quantity thereof changing depending on a change in the physical properties of at least a portion of the reaction unit 100 (the reaction unit 100a or 100b) due to the infrared light I (S300), and an operation of outputting, as an image, the distribution of the light quantity of the detected measurement light V (S400).

The irradiating of the measurement light V (S100) is performed by irradiating the reaction unit 100 (the reaction unit 100a or 100b) with the measurement light V by the light source unit 200 (the light source unit 200a or 200b).

In this case, the measurement light V emitted from the light source unit 200 (the light source unit 200a or 200b) may include the visible light. The irradiating of the measurement light V (S100) may include irradiating the measurement light V toward the reaction unit 100 (the reaction unit 100a or 100b) at the preset incident angle. As described above, the second optical parts 220a and 220b for concentrating the measurement light V may be respectively provided on paths along which the measurement light V is emitted between the light source 210a and the reactive layer 110a and between the light source 210b and the reactive layer 110b.

The irradiating of the measurement light V (S100) may include irradiating the reaction unit 100 (the reaction unit 100a or 100b) with the measurement light V such that the regions, to which the infrared light I is input, are all superimposed. For example, the infrared imaging method in accordance with an exemplary embodiment detects, by using the measurement light V, a change in the physical properties of the at least a portion of the reaction unit 100 (the reaction unit 100a or 100b) depending on the input infrared light I. Thus, the irradiating of the measurement light V (S100) may include irradiating the reaction unit 100 (the reaction unit 100a or 100b) with the measurement light V such that the regions, to which the infrared light I is input, are all superimposed, in order to irradiate all of the regions of the reaction unit 100 (the reaction unit 100a or 100b), to which the infrared light I is input, with the measurement light V.

The detecting of the measurement light V (S300) includes detecting the measurement light V with the light quantity thereof changing depending on a change in the physical properties of the at least a portion of the reaction unit 100 (the reaction unit 100a or 100b) due to the infrared light I. In this case, the at least a portion of the reaction unit 100 (the reaction unit 100a or 100b) may include, for example, the reactive layer 110a or 110b, and the physical properties of the reactive layer 110a or 110b may include the electrical, thermal, chemical, and mechanical properties of the reactive layer 110a or 110b. For example, the electrical, thermal, chemical, and mechanical properties of the reactive layer 110a or 110b may variously change according to the distribution of the light quantity of the input infrared light I.

The detecting of the measurement light V (S300) includes detecting the measurement light V with the light quantity thereof changing depending on the input infrared light I. When the infrared light I, emitted from the target T, is input to the reaction unit 100 (the reaction unit 100a or 100b), the physical properties of the at least a portion of the reaction unit 100 (the reaction unit 100a or 100b) are changed. The change in the physical properties of the reaction unit 100 (the reaction unit 100a or 100b) causes a change in the light quantity of the measurement light V, and the imaging unit 300 (the imaging unit 300a or 300b) detects the measurement light V with the increased light quantity.

In this case, when the infrared imaging apparatus 1 in accordance with an exemplary embodiment is used, the detecting of the measurement light V (S300) may include an operation of changing the reflectance of the measurement light V depending on a change in the physical properties of the reactive layer 110a and an operation of detecting the measurement light V with the changed reflectance.

The reactive layer 110a may include the absorption layer 114a formed of nanoparticles including quantum dots and provided on the metal layer 130a and the electric charge supply layer 116a having a liquid state and provided on the absorption layer 114a. Further, the reactive layer 110a may further include the electric charge accumulation layer 112a formed of metal nanoparticles and provided between the metal layer 130a and the absorption layer 114a. In this case, an amount of electric charges on the surface of the reactive layer 110a may be changed by the input infrared light I in the operation of changing the reflectance of the measurement light V.

The reactive layer 110a may also include the liquid crystal layer 118a formed of graphene nanoparticles dispersed into the liquid crystal. In this case, the temperature of the liquid crystal may be increased in response to the input infrared light I in the operation of changing the reflectance of the measurement light V.

For example, the operation of changing the reflectance of the measurement light V may include an operation of changing, by the input infrared light I, the surface plasmons of the regions irradiated with the measurement light V. A detailed description thereof is the same as that described above with reference to the infrared imaging apparatus 1 in accordance with an exemplary embodiment, and a duplicate description thereof will thus be omitted.

Further, when the infrared imaging apparatus 1 in accordance with another exemplary embodiment is used, the detecting of the measurement light V (S300) may include an operation of changing the transmittance of the measurement light V depending on a change in the physical properties of the reactive layer 110b and an operation of detecting the measurement light V with the changed transmittance.

In this case, the reactive layer 110b may include the liquid crystal layer 118a formed of graphene nanoparticles dispersed into the liquid crystal, and the temperature of the liquid crystal may be increased in response to the input infrared light I in the operation of changing the reflectance of the measurement light V.

For example, the operation of changing the transmittance of the measurement light V may include an operation of changing, by the input infrared light I, the temperature of the regions irradiated with the measurement light V. A detailed description thereof is the same as that described above with reference to the infrared imaging apparatus 1 in accordance with another exemplary embodiment, and a duplicate description thereof will thus be omitted.

The outputting of the distribution of the light quantity of the measurement light V as an image (S400) includes outputting the distribution of the light quantity of the detected measurement light V as an image. For example, the infrared light I is input from the target T to the reaction unit 100 (the reaction unit 100a or 100b), and, depending on the distribution of the light quantity of the input infrared light I, the physical properties of the reactive layer 110a or 110b may variously change by nanoparticle. The distribution of the physical properties of the reactive layer 110a or 110b changes the light quantity of the measurement light V to cause various light quantity distributions, and the imaging unit 300 (the imaging unit 300a or 300b) outputs the distribution of the light quantity of the measurement light V as an image.

In this case, the detecting of the measurement light V (S300) and the outputting of the distribution of the light quantity of the measurement light V as an image (S400) may be all performed by the imaging unit 300 (the imaging unit 300a or 300b), and the imaging unit 300 (the imaging unit 300a or 300b) may include the image sensor 310a or 310b, such as a CCD camera, for detecting the measurement light V and outputting the detected measurement light V as an image, as described above.

An apparatus and a method for infrared imaging, in accordance with an exemplary embodiment, may detect, by an optical method, a change in the physical properties of a reaction unit depending on infrared light and may output the detected change as an image, thereby requiring no compound semiconductor based on indium gallium arsenide (InGaAs).

Further, a high-resolution image may be output because a change in the physical properties of the reaction unit are made by nanoparticles each having a particle diameter of several nanometers.

In the above, although the exemplary embodiments of the present invention have been illustrated and described using specific terms, such terms are merely for the purpose of clarifying the invention. It would be obvious that various changes and modifications may be made to the embodiments and terms of the invention without departing from the spirit and scope of the following claims. Such modified embodiments should not be individually understood from the spirit and scope of the present invention, but should be construed as being within the claims of the present invention.

What is claimed is:

1. An infrared imaging apparatus for receiving infrared light emitted from a target and outputting the received infrared light as an image, the infrared imaging apparatus comprising:
    a reaction unit comprising a reactive layer with physical properties changing in a response to received infrared light;
    a light source disposed to irradiate the reaction unit with a measurement light; and
    an image sensor disposed to detect the measurement light having passed through the reaction unit,
    wherein the reactive layer comprises:
        an absorption layer formed of nanoparticles, each nanoparticle of the nanoparticles comprising a quantum dot; and an electric charge supply layer having a liquid state and provided on the absorption layer.

2. The infrared imaging apparatus of claim 1, wherein the measurement light comprises visible light, and the image sensor converts the visible light into electric charges and outputs the electric charges as an image.

3. The infrared imaging apparatus of claim 1, wherein the reaction unit further comprises: a dielectric; and a metal layer provided on the dielectric, wherein the reactive layer is provided on the metal layer.

4. The infrared imaging apparatus of claim 3, wherein the light source is disposed to irradiate a surface of the metal layer with the measurement light via the dielectric at a preset incident angle, and the image sensor is disposed to detect the measurement light reflected from the surface of the metal layer.

5. The infrared imaging apparatus of claim 4, wherein the light source is disposed such that the measurement light is emitted at an incident angle at which the measurement light resonates with surface plasmons of the metal layer while the infrared light is not input thereto.

6. The infrared imaging apparatus of claim 3, wherein the reactive layer further comprises an electric charge accumulation layer formed of metal nanoparticles and provided between the metal layer and the absorption layer.

7. The infrared imaging apparatus of claim 1, wherein the quantum dot comprises PbS and/or PbSe, and the electric charge supply layer comprises triethanolamine-hydrochloride (TEA-HCl).

8. An infrared imaging apparatus for receiving infrared light emitted from a target and outputting the received infrared light as an image, the infrared imaging apparatus comprising:
    a reaction unit comprising a reactive layer with physical properties changing in a response to received infrared light;
    a light source disposed to irradiate the reaction unit with a measurement light; and an image sensor disposed to detect the measurement light having passed through the reaction unit, wherein the light source is disposed to emit the measurement light in a direction crossing an input direction of the received infrared light, and the reaction unit further comprises a dichroic mirror disposed at a position, where the dichroic mirror is configured to cross an irradiation direction of the measurement light with the input direction of the received infrared light to input the received infrared light and the measurement light to the reactive layer in a same direction.

9. The infrared imaging apparatus of claim 8, further comprising:

a first polarizing plate configured to polarize the measurement light output from the light source, and a second polarizing plate configured to polarize the measurement light having passed through the reaction unit.

10. The infrared imaging apparatus of claim 9, wherein the first polarizing plate and the second polarizing plate have optical axes in a same direction as each other or in directions orthogonal to each other.

11. The infrared imaging apparatus of claim 8, wherein the dichroic mirror transmits the received infrared light and reflects the measurement light.

12. The infrared imaging apparatus of claim 8, wherein the reactive layer comprises a liquid crystal layer formed by dispersing, into liquid crystal, graphene nanoparticles or reduced graphene oxide nanoparticles.

13. An infrared imaging method comprising:

inputting infrared light, emitted form a target, to a reaction unit;

irradiating the reaction unit with a measurement light;

detecting the measurement light with a light quantity thereof changing depending on a change in physical properties of at least a portion of the reaction unit due to the input infrared light; and outputting a distribution of the light quantity of the detected measurement light, wherein detecting the measurement light comprises:

changing a transmittance of the detected measurement light depending on the change in the physical properties of the at least a portion of the reaction unit; and detecting the measurement light with the changed transmittance.

14. The infrared imaging method of claim 13, wherein the irradiating the reaction unit with the measurement light comprises: irradiating, with the measurement light, an area in which regions, to which the infrared light is input, are all superimposed.

* * * * *